United States Patent [19]
Nishizato et al.

[11] Patent Number: 5,272,880
[45] Date of Patent: Dec. 28, 1993

[54] LIQUID VAPORIZER-FEEDER

[75] Inventors: Hiroshi Nishizato, Chiba; Hirofumi Ono, Shiga, both of Japan

[73] Assignees: Applied Materials, Inc., Santa Clara, Calif.; Lintec Co., Ltd., Japan

[21] Appl. No.: 822,179

[22] Filed: Jan. 16, 1992

[51] Int. Cl.⁵ .............................. F17C 13/00
[52] U.S. Cl. ........................... 62/50.7; 62/50.2
[58] Field of Search .................... 62/50.7, 50.2

[56] References Cited

U.S. PATENT DOCUMENTS 3,950,959 4/1976 Coureau .................. 62/50.7

FOREIGN PATENT DOCUMENTS 560677 4/1957 Italy .
PCT/US91/-03980 6/1991 PCT Int'l Appl. .

*Primary Examiner*—Ronald C. Capossela
*Attorney, Agent, or Firm*—Keiichi Nishimura

[57] ABSTRACT

A liquid vaporizer-feeder has a unitary housing structure for both a control valve for controlling the amount of a liquid passing therethrough and a vaporization valve for causing the liquid from the control valve to be vaporized and transported out by a carrier gas. The housing structure has a throughhole through which the two valves are connected. The throughhole is short and narrow, and has a portion made even narrower such that the pressure in the liquid passing therethrough is increased, preventing bubbles from forming in the throughhole. As a result, vaporized liquid can be supplied at a steadier rate, for example, to a reaction chamber.

8 Claims, 6 Drawing Sheets

५,272,880

LIQUID VAPORIZER-FEEDER

BACKGROUND OF THE INVENTION

This invention relates to a liquid vaporizer-feeder. More specifically, this invention relates to an improved vaporizer-feeder capable not only of supplying a source liquid accurately but also of accurately controlling the transportation of liquids such as alcohols and organic acids that are widely used in chemical industries. Such a liquid vaporizer-feeder is useful in a semiconductor fabrication process, for example, for accurately controlling the flow rate of tetraethyl orthosilicate (TEOS) for the formation of a thin film and, in particular, in the case where the vaporized liquid is transported to a reaction chamber in a reduced-pressure condition.

To explain the background of the present invention by way of a chemical vapor deposition (CVD) process in the production of a semiconductor device, it is to be noted that TEOS is recently coming to be seriously considered as a layer-to-layer insulating film material for semiconductor wafers. One of the reasons for this choice is its superior step coverage because the rate determination is by surface reaction. This is to be contrasted to the deposition mechanism by $SiH_4$ with the conventional reduced-pressure CVD. Another reason is that $SiH_4$ is extremely reactive and there is a relatively high probability of an explosion. By contrast, TEOS is safer and easier to store, and its cost, as a source material, is expected to become lower in the future.

Examples of CVD method using TEOS include the reduced-pressure CVD, the normal-pressure CVD and the plasma CVD. If a reaction chamber is used at a normal pressure as in the case of a normal-pressure CVD method, the pressure inside the pipes should be raised higher, as one moves farther upstream from the reaction chamber because, otherwise, the source liquid would not flow through the piping. In the case of the reduced-pressure or plasma CVD method, the source liquid naturally flows into the reaction chamber because the reaction chamber is in a reduced-pressure condition.

FIG. 6A shows a schematic diagram of a system for using TEOS, including a reaction chamber 50' and a prior art liquid vaporizer-feeder (liquid mass flow controller) 40' of a type which has been in common use, comprising a sensor tube 1', a bypass tube 2', a flow rate control valve 7' and a vaporization valve 12' which introduces a carrier gas H' (with or without a reaction gas R') and sends our a mixed gas Kn'. The flow rate control valve 7' is unitarily connected to a housing 16' which contains the sensor tube 1' and the bypass tube 2'. The flow rate control valve 7' is also connected through an elongated connector tube 23' to the vaporization valve 12' which is set inside a thermostat 45'.

Assume now that the reaction chamber 50' is operating under a normal-pressure condition. FIG. 6B shows the pressure on the source liquid L' in this system. If we further assume that $P_2 = 1$ kg/cm$^2$ and $P_1 = 2$ kg/cm$^2$, the pressure difference $\Delta P$ is 1 kg cm$^2$. In other words, a pressure difference of about 1 kg/cm$^2$ is generated across the connector tube 23', and, as the liquid L' approaches the vaporization valve 12' by flowing through the connector tube 23', its pressure drops gradually and the gas dissolved therein begins to bubble out.

Assume next that the reaction chamber 50' is operating under a reduced-pressure condition with $P_2 = 0$ kg/cm$^2$ and $P_l = 1$ kg/cm$^2$. In this situation, too, the pressure difference ($\Delta P$) is 1 kg cm$^2$, but this causes not only the dissolved gas to bubble out but also the source liquid L' itself to vaporize. In other words, more bubbles are generated in this situation than when the reaction chamber 50' is operating under a normal-pressure condition. If the connector tube 23' is made longer, both the amount of the source liquid L' inside and the generation of bubbles increase accordingly. As the source liquid L' is supplied to the vaporization valve 12' and is vaporized therein, these bubbles burst and cause variations in the flow rate of the liquid L', as shown in FIG. 7.

FIG. 7 shows the time rate of change in the reaction pressure inside the reaction chamber 50'. As the vaporization valve 12' is opened, TEOS gas is carried by a carrier gas (H) and supplied into the reaction chamber 50', causing a sudden rise in the reaction pressure inside the chamber 50'. After the pressure reaches a certain level, it remains more or less at this level, rising again after a while and resulting in a sawtooth waveform. This sawtooth waveform is precisely the result of the variations in the pressure caused by the bursting of the bubbles mentioned above. If the vaporization valve 12' is closed about 4 minutes after it was opened, the reaction pressure inside the reaction chamber 50' decreases gradually first and then drops suddenly. Such variations in the reaction pressure inside the reaction chamber, caused by the bursting of the bubbles, have adverse effects on the semiconductor wafer processing.

SUMMARY OF THE INVENTION

It is a general object of the invention to provide a liquid vaporizer-feeder with which a CVD or other processes using a source liquid can be carried out under a steady pressure condition inside a reaction chamber.

It is a more specific object of the invention to provide a liquid vaporizer-feeder capable of supplying a source liquid such as TEOS without causing bubbles to be generated not only under normal-pressure conditions but also under reduced-pressure conditions.

A liquid vaporizer-feeder embodying the present invention, with which the above and other objects can be accomplished, is similar to the prior art vaporizer-feeder described above in that it comprises a sensor tube, a bypass tube, a flow rate control valve and a vaporization valve. It is distinguishable, however, in that both the flow rate control valve and the vaporization valve are set inside a thermostat and they are connected to each other through a throughhole formed through a housing block. According to a preferred embodiment of the invention, this connecting throughhole has a narrowed portion along its length such that the pressure increases in the liquid which passes therethrough, thereby preventing bubbles from being generated. Such a narrowed portion is preferably formed at the downstream end of the throughhole where it opens into the vaporization valve.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings.

DETAILED DESCRIPTION OF THE INVENTION

Figure 1A:
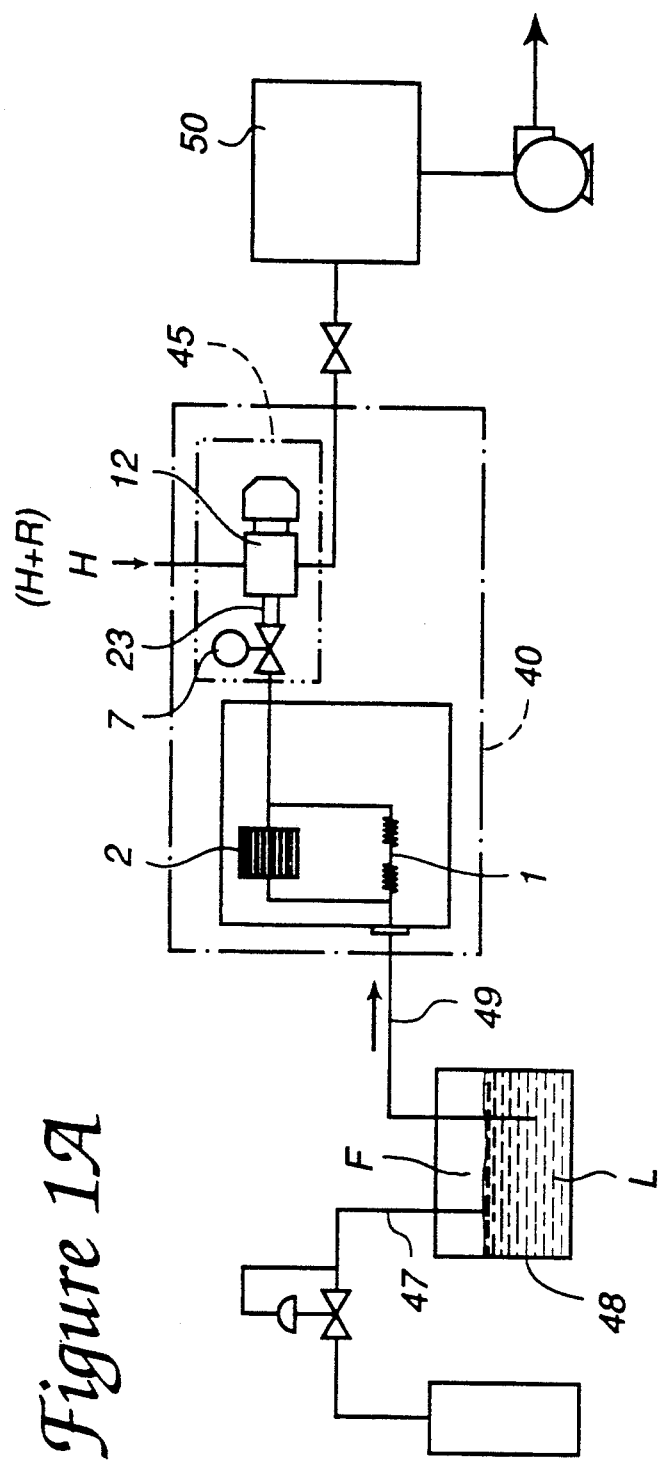
FIG. 1A is a schematic diagram of a system including a reaction chamber and a liquid vaporizer-feeder according to the present invention.
Figure 1B:
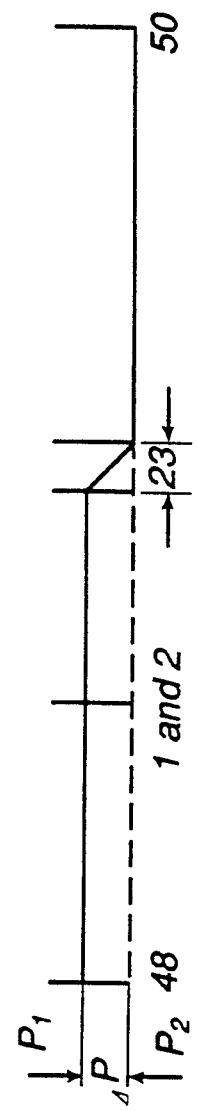
FIG. 1B is a graph showing the liquid pressure in such a system.

As shown schematically in FIG. 1A, a liquid vaporizer-feeder (or liquid mass flow controller) 40 according to the present invention is comprised of a sensor tube 1, a bypass tube 2, a flow rate control valve 7 and a vaporization valve 12. The sensor tube 1 is a capillary tube adapted to measure the mass flow rate of the liquid L which flows therethrough. The bypass tube 2 is connected parallel to the sensor tube 1 and is so designed that the flow rate of the liquid L therethrough will be proportional to the flow rate of the liquid through the sensor tube 1. The flow rate control valve 7 is adapted to control the flow rate of the liquid L which flows out of the sensor tube 1 or out of both the sensor tube 1 and the bypass tube 2. The vaporization valve 12 is adapted to vaporize by means of a carrier gas (H) the source liquid L, of which the flow rate has been controlled by the flow rate control valve 7, and to supply the vaporized source liquid to a reaction chamber 50 for a next process. Unlike the prior art vaporizer-feeder 40' described above with reference to FIG. 6A, the vaporizer-feeder 40 embodying the present invention may be characterized as having its flow rate control valve 7 and vaporizer valve 12 joined together unitarily and connected together through a throughhole 23 formed in a housing block 23b, both the flow rate control valve 7 and the vaporization valve 12 being set inside a thermostat 45. FIG. 1B shows the pressure on the source liquid L in the system of FIG. 1A. The symbols used in FIG. 1B mean the same as in FIG. 6B.

Next, the operation of the liquid vaporizer-feeder 40 of the present invention will be described in connection with a system shown in FIG. 1A, which includes, in addition to the liquid vaporizer-feeder 40, a reaction chamber 50, a tank 48 for the source liquid L and gas containers (not shown) containing the carrier gas and a selection of other gases. The tank 48 is essentially an air-tight container containing the source liquid L therein with the space above the source liquid L connected to a supply tube 47 for delivering an inactive gas (F). The source liquid L is transported to the vaporizer-feeder 40 through a liquid pipe 49 as the inactive gas (F) is introduced into the space above the liquid L inside the tank 48 in order to increase the internal pressure of the tank 48.

Helium gas is used as the carrier gas (H) according to an embodiment of the invention but the choice of carrier gas is not intended to limit the scope of the invention. Examples of reaction gases (R), which are individually stored in separate containers and may be mixed with the carrier gas (H), include oxygen, $C_2F_6$ and $NF_3$.

Figure 2:
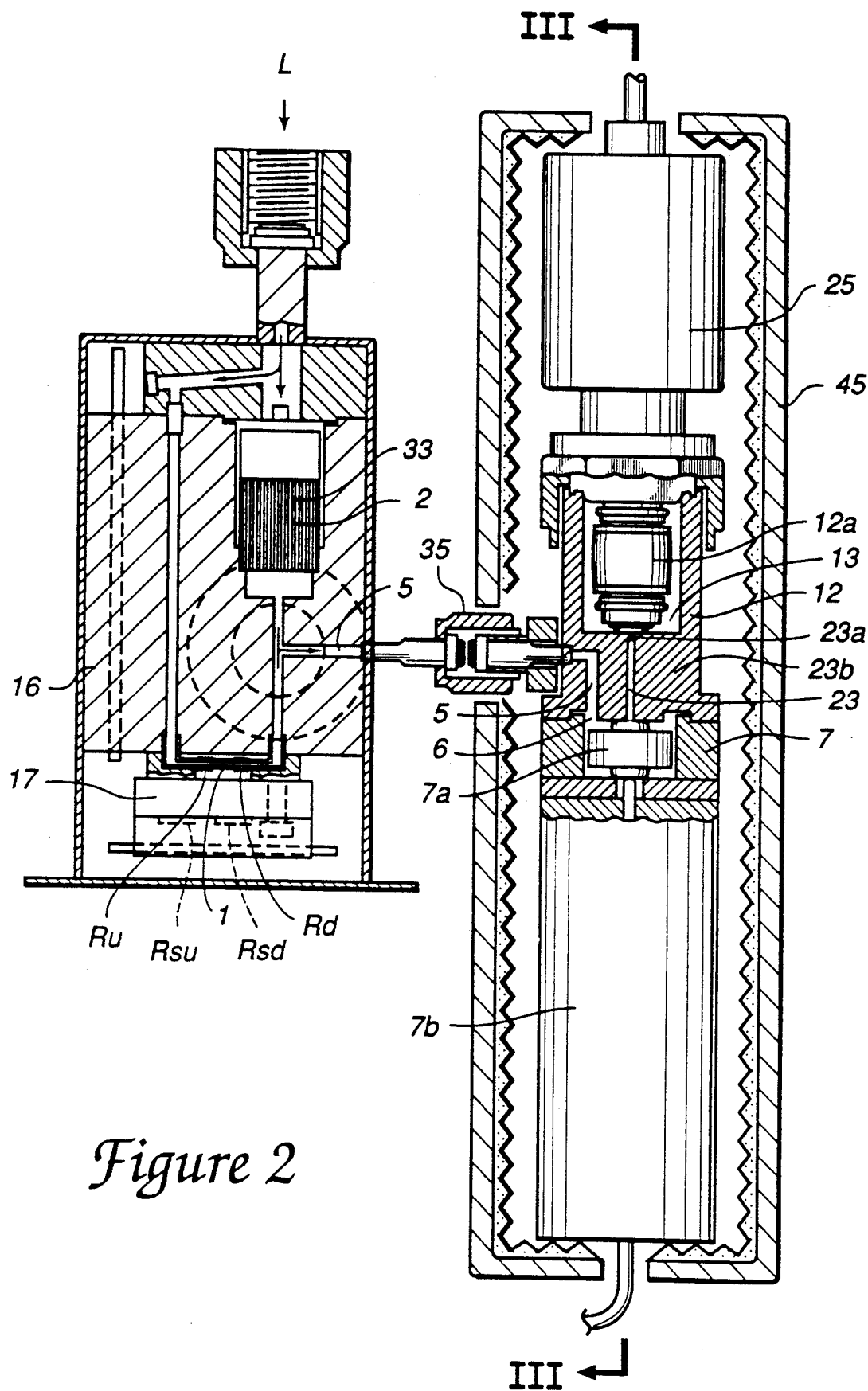
FIG. 2 is a frontal sectional view of the liquid vaporizer-feeder embodying the present invention.

The structure of the liquid vaporizer-feeder 40 is explained next more in detail with reference to FIGS. 2, 3 and 4. As can be seen in FIG. 2, the sensor tube 1 includes an extremely thin capillary tube disposed horizontally near the bottom of a sensor housing structure 16. The direction of flow of the liquid L is indicated by arrows. Two thermal sensors Ru and Rd are provided at mutually separated upstream and downstream positions on the sensor tube 1. Disposed below these thermal sensors Ru and Rd through a heat sink 17, there are base plate resistors Rsu and Rsd serving as ambient temperature detectors.

The bypass tube 2 is capable of passing a large amount of the liquid L therethrough and is adapted to pass the liquid L in proportion to the rate at which the liquid flows through the sensor tube 1. It includes vertically oriented liquid passages 33 such that the incoming liquid L flows vertically downward. The outlets of the sensor tube 1 and the bypass tube 2 are joined together and connected to a connector tube 5 which serves as the inlet for the flow rate control valve 7.

Figure 3:
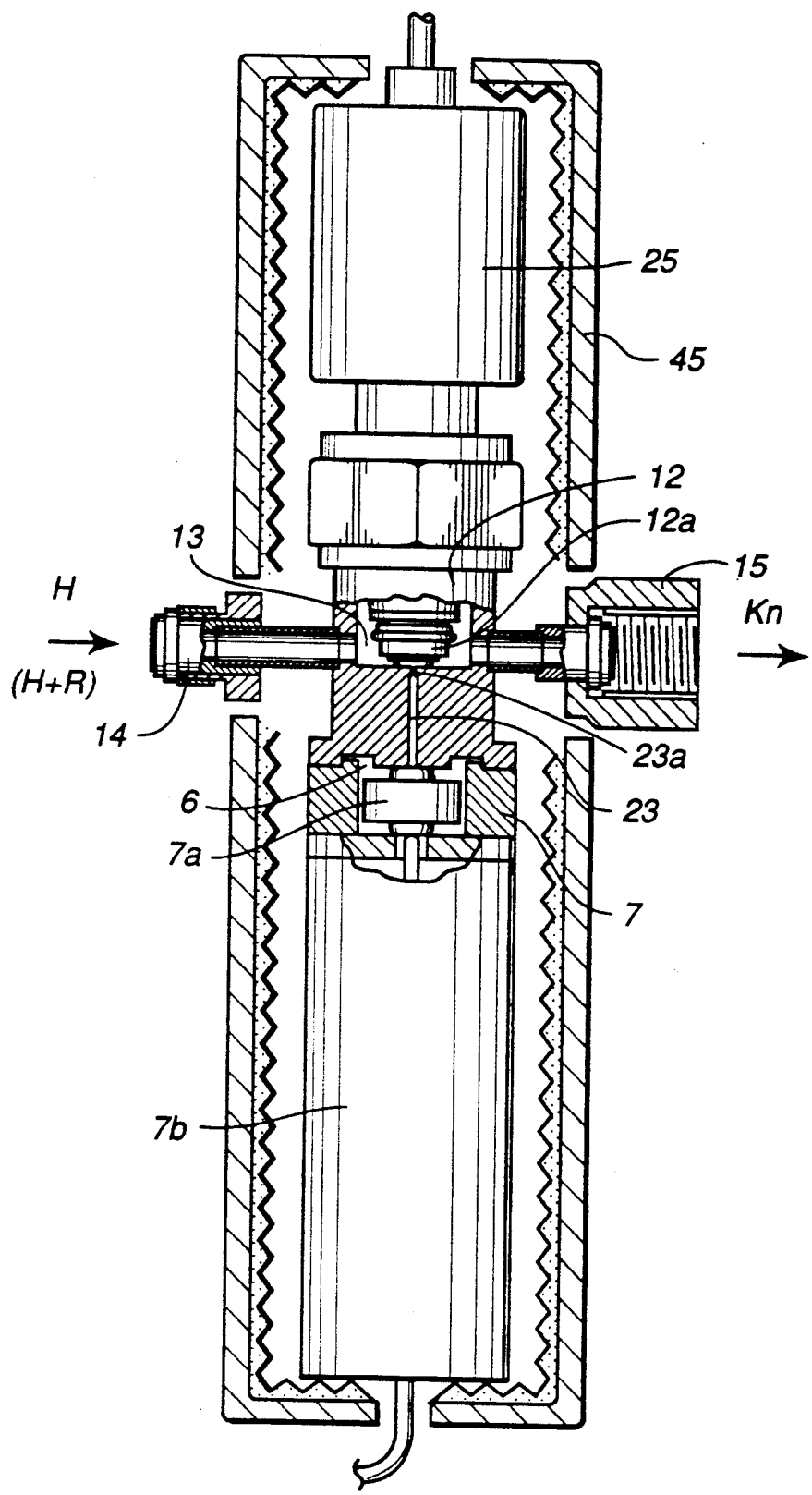
FIG. 3 is a sectional view of the liquid vaporizer-feeder of FIG. 2 taken along the line III—III in FIG. 2.

As can be seen both in FIG. 2 and in FIG. 3, the flow rate control valve 7 and the vaporization valve 12 together form a single unit, both contained in a single housing block 23b with the vaporization valve 12 disposed above the flow rate control valve 7 and both being contained inside a thermostat 45. The flow rate control valve 7 is connected to the sensor housing structure 16 by means of a coupler 35 on the aforementioned connector tube 5.

It is also to be noted that the flow rate control valve 7 and the vaporization valve 12 are connected to each other through a throughhole 23 formed through the housing block 23b. Since these two valves 7 and 12 are unitized, as explained above, this throughhole 23 can be made extremely short. As shown more clearly in FIG. 4, a portion (23a) of this throughhole 23 adjoining the vaporization valve 12 is made narrower, having a smaller inner diameter than elsewhere. This causes the liquid pressure to rise, preventing bubbles from being generated inside the liquid L, as it passes therethrough.

Figure 4:
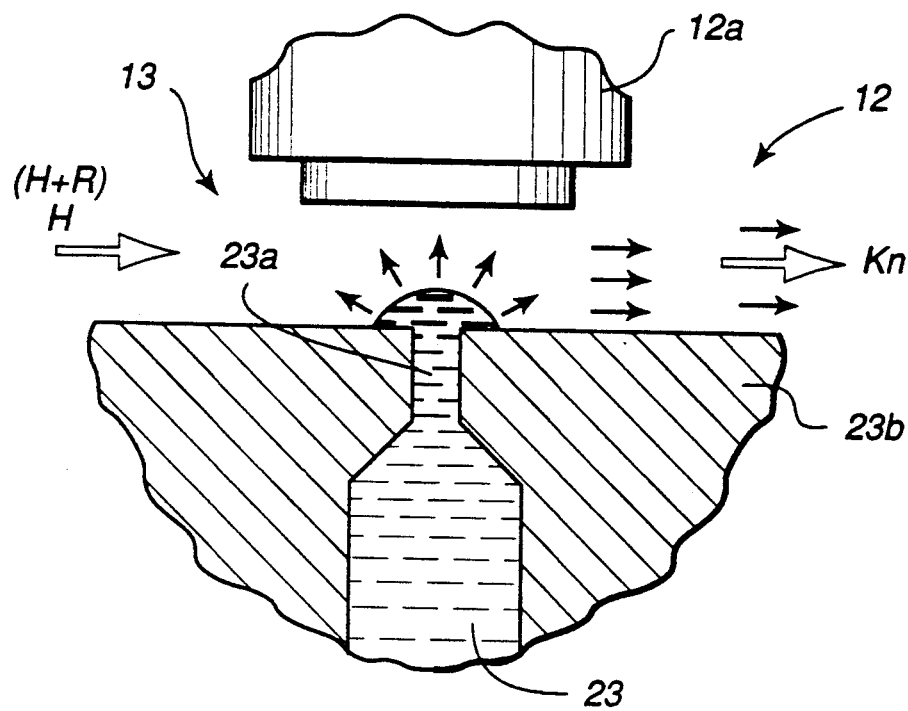
FIG. 4 is an enlarged sectional view of a part of the vaporization valve according to the present invention.

In FIGS. 2, 3 and 4, numeral 13 indicates a vaporization control chamber inside the vaporization valve 12, connected both to a carrier gas inlet 14 and to a mixed gas outlet 15. The carrier gas inlet 14 is connected to the container of a carrier gas, and the mixed gas outlet 15 is connected to the reaction chamber 50 where the next process is to take place.

The flow rate control valve 7 has a valve body 7a inside a flow rate control chamber 6, to which is connected the connector tube 5 leading to the sensor housing structure 16. The inlet opening of the throughhole 23 is adjusted by accurately controlling the valve body 7a by means of a piezo-actuator or a solenoid actuator 7b such that the amount of the liquid L to be supplied to the vaporization valve 12 from the connector tube 5 through the flow rate control chamber 6.

The vaporization valve 12 consists essentially of a driver unit 25 and a valve body 12a which is disposed at the center of the lower surface of the driver unit 25 such that the outlet opening of the throughhole 23 into the vaporization control chamber 13 can be opened and closed by operating the driver unit 25.

The reaction chamber 50 may contain, for example, a semiconductor production device such as a CVD device. As an inactive gas (F) such as helium or nitrogen is supplied into the upper space inside the source tank 48 to thereby increase the pressure inside the tank 48, the liquid L inside the tank 48 is introduced into the liquid vaporizer-feeder 40. The liquid vaporizer-feeder 40 operates as described above to cause a desired amount of the liquid L to be delivered to the vaporization valve 12.

Figure 5:
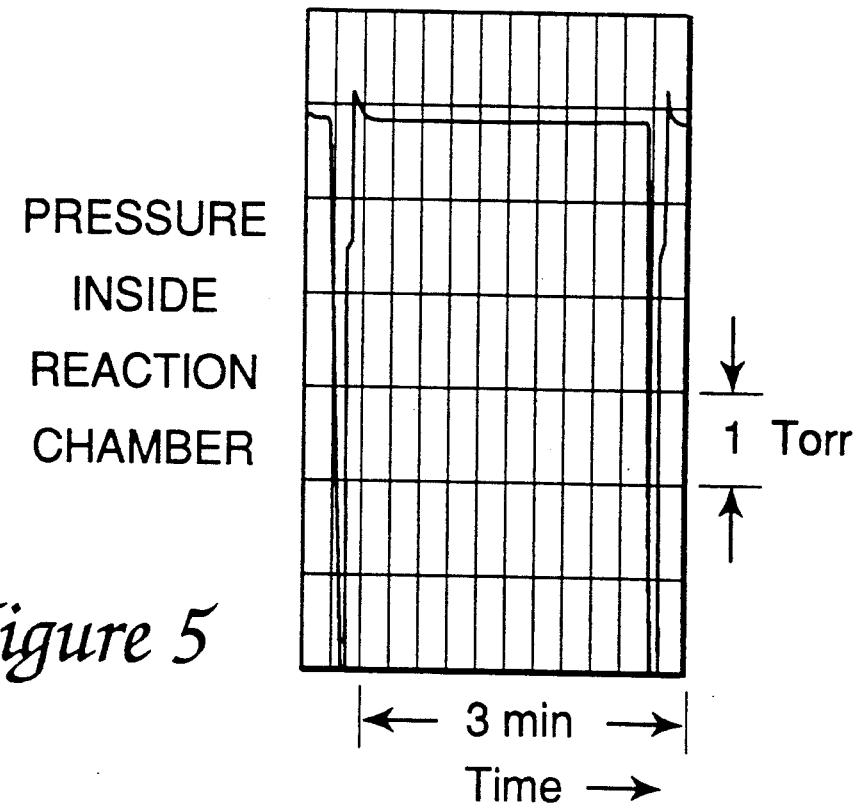
FIG. 5 is a graph showing the variations in the reaction pressure inside the reaction chamber of FIG. 1A connected to the liquid vaporizer-feeder of the present invention as shown.
Figure 7:
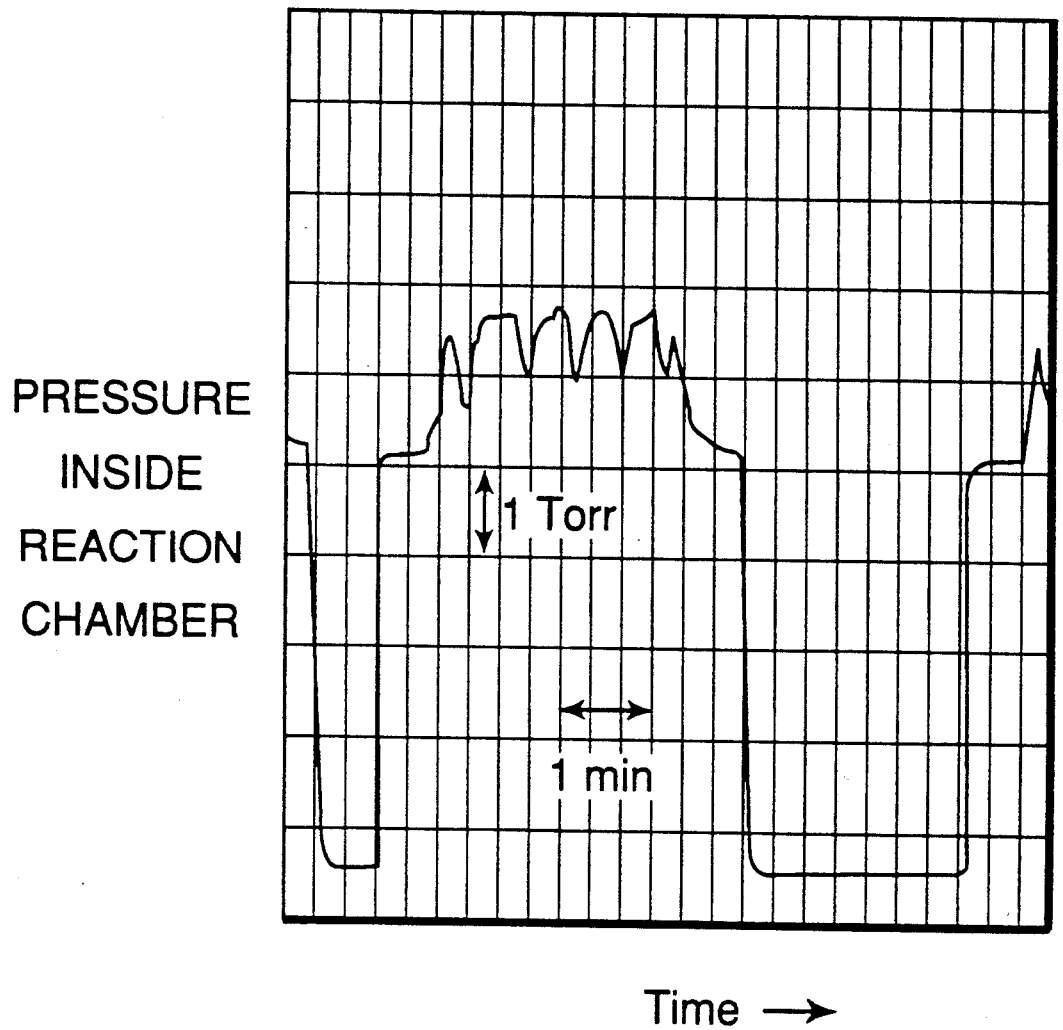
FIG. 7 is a graph showing the variations in the reaction pressure inside a reaction chamber when a prior art liquid vaporizer-feeder of FIG. 6A is used.

If the interior of the reaction chamber 50 is in a reduced-pressure condition, the interior of the vaporization control chamber 13 is also in a reduced-pressure condition. Although this would normally tend to cause the source liquid L to form bubbles at the junction where the throughhole 23 opens to the vaporization control chamber 13, such generation of bubbles is prevented according to the present invention because the throughhole 23 through the housing block 23b is very short and hence the volume of the liquid inside the throughhole 23 is extremely small. Moreover, if the throughhole 23 has a narrowed portion 23a where it opens to the vaporization control chamber 13, as shown in FIG. 4 according to a preferred embodiment of the invention, the liquid pressure at such a narrowed portion is increased, allowing more gas to remain dissolved in the liquid L and hence preventing the generation of bubbles. For this reason, the source liquid L is delivered into the vaporization valve 12 without bubbles. As a result, the pressure rises quickly inside the reaction chamber 50 as soon as the vaporization valve 12 is opened, and the source liquid L can continue to be supplied in a stable manner. This is demonstrated in FIG. 5 by a graph, which is drawn similarly to FIG. 7. The experimental result presented in FIG. 5 shows clearly that the interior pressure of the reaction chamber can be maintained steadily while a source liquid is being supplied thereinto by a liquid vaporizer-feeder according to the present invention.

As the source liquid L is delivered to the vaporization valve 12, it passes through the throughhole 23 and its front end becomes exposed. Since the interior of the thermostat 45 is maintained at an elevated temperature, the source liquid L thus delivered is gradually vaporized from its exposed front end, as shown in FIG. 4. The interior of the thermostat 45, however, need not be constantly kept at an elevated temperature. Alternatively, the vaporization of the source liquid L may be effected simply by its contact with the flow of a carrier gas (H) such as helium gas (or a mixture of a carrier gas (H) and a reaction gas (R)) which is being introduced into the vaporization control chamber 13 through the carrier gas inlet 14. The mixed gas (Kn), now containing the vaporized source liquid, leaves the vaporization control chamber 13 through the mixed gas outlet 15 and is delivered to the reaction chamber 50 while being heated to a desired temperature level by means of a line heater (not shown).

Figure 6A:
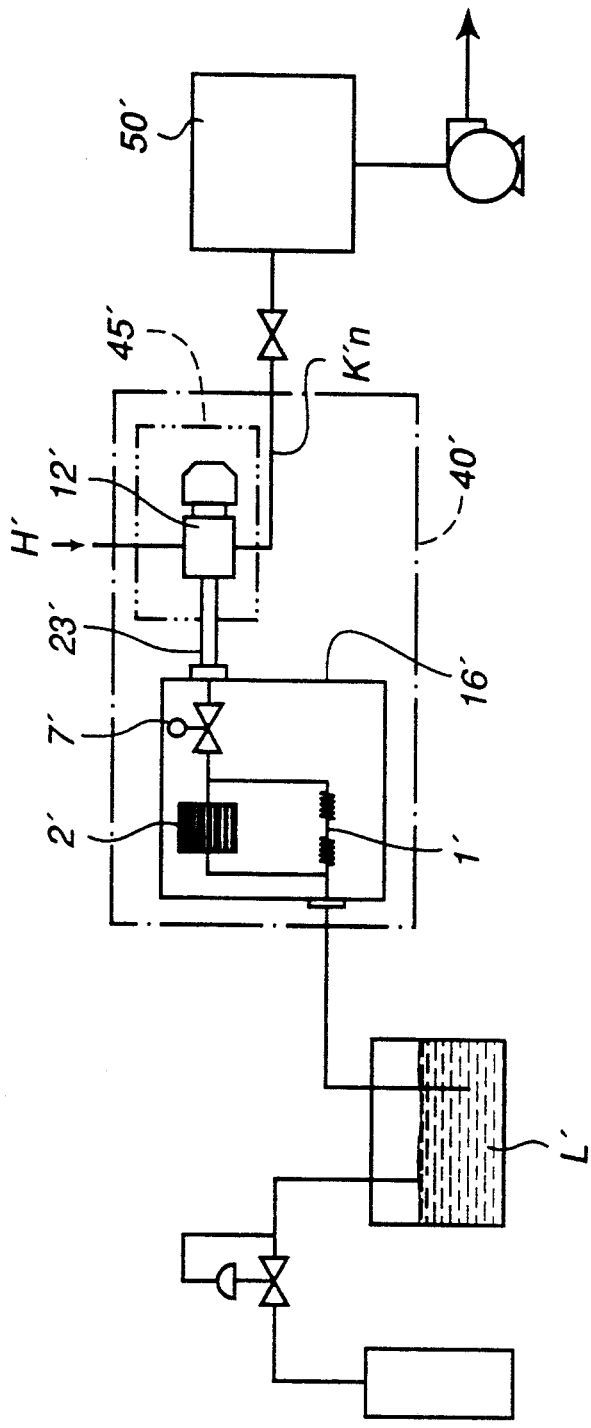
FIG. 6A is a schematic diagram of a system including a reaction chamber and a prior art liquid vaporizer-feeder and FIG. 6B is a graph showing the liquid pressure in such a system.
Figure 6B:
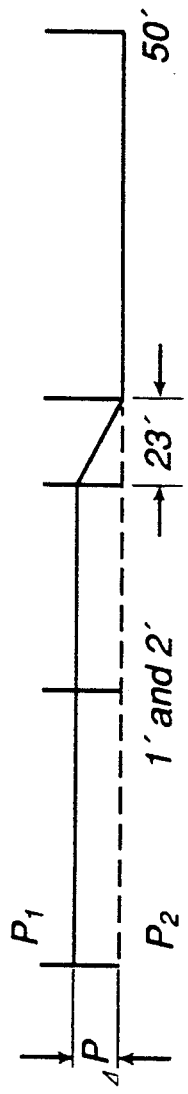

With a prior art vaporizer-feeder of the type shown in FIG. 6A, the connector tube 23' is typically about 50 mm in length and about 2 mm in internal diameter. In a liquid vaporizer-feeder designed according to the present invention, not only are the flow rate control valve 7 and the vaporization valve 12 unified, but the dimensions of the throughhole 23 connecting them are significantly reduced, its length being reduced to about 10 mm and its inner diameter to about 1 mm. Thus, the volume of the liquid between the two valves is reduced to $(\frac{1}{2})^2 \times (10/50) = 1/20$ of the amount in the prior art vaporizer-feeder. In other words, the maximum amount of bubbles that may be generated can also be reduced by the same factor.

The present invention has been described above by way of only a single example. This example, however, is intended to be interpreted broadly, and not as being limitative. Many modifications and variations can be made to this example within the scope of this invention. For example, although FIG. 4 shows the narrowed portion 23a of the throughhole 23 at the downstream end of the throughhole 23 where it opens to the vaporization control chamber 13, such a narrowed portion may be formed elsewhere along the throughhole 23.

In summary, a liquid vaporizer-feeder according to the present invention is characterized as having its flow rate control and vaporization valves formed unitarily and connected to each other through a short throughhole such that the amount of source liquid between the valves (that is, inside the connecting throughhole) can be significantly reduced and hence that the generation of bubbles inside the throughhole can be effectively inhibited. As a result, the pressure inside the reaction chamber, to which the vaporized source liquid is delivered, can be maintained at a uniform constant rate not only when the reaction chamber is operated in a normal-pressure condition but also when it is operated at a reduced pressure. If a portion of this throughhole is made narrower and if, in particular, this narrowed portion is where the throughhole opens to the vaporization valve, the liquid pressure increases at such a narrowed portion and the generation of bubbles can be additionally controlled.

What is claimed is:

1. In a liquid evaporator-feeder comprising:
   a sensor tube adapted to measure the mass flow rate of a liquid passing therethrough;
   a bypass tube capable of allowing said liquid to flow therethrough at a rate proportional to the flow rate of said liquid through said sensor tube;
   a control valve for controlling the amount of said liquid passing therethrough, said control valve being connected to said sensor tube and said bypass tube so as to receive said liquid from both said sensor and bypass tubes; and
   a vaporization valve for causing said liquid, of which the amount has been controlled by said control valve, to be vaporized and transported out by a carrier gas;
   the improvement wherein said control valve and said vaporization valve are connected through a passage such that said liquid can be caused to flow from said control valve into said vaporization valve through said passage.

2. The liquid vaporizer-feeder of claim 1 wherein both said control valve and said vaporization valve are contained inside a unitary housing structure and said passage is formed as a throughhole through said housing structure.

3. The liquid vaporizer-feeder of claim 1 wherein said passage has a narrowed portion where the internal cross-sectional area of said passage is reduced.

4. The liquid vaporizer-feeder of claim 3 wherein said narrowed portion of said passage is at the downstream end of said passage adjacent said vaporization valve.

5. The liquid vaporizer-feeder of claim 1 wherein said vaporization valve includes a valve body, a vaporization control chamber into which said passage opens, and a driving unit for causing said valve body to move and to thereby selectively open and close said passage.

6. The liquid vaporizer-feeder of claim 2 wherein said sensor tube comprises a capillary tube which is disposed horizontally.

7. The liquid vaporizer-feeder of claim 6 wherein said bypass tube is connected in parallel with said sensor tube and includes vertically orientated liquid passages.

8. The liquid vaporizer-feeder of claim 1 wherein said passage is about 10 mm in length and about 1 mm in internal diameter.

* * * * *